(12) United States Patent
Eichenseher et al.

(10) Patent No.: US 10,082,116 B2
(45) Date of Patent: Sep. 25, 2018

(54) CONTROL DEVICE FOR ACTUATING AT LEAST ONE FUEL INJECTION VALVE, AND A SWITCH ARRANGEMENT COMPRISING SUCH A CONTROL DEVICE

(71) Applicant: CONTINENTAL AUTOMOTIVE GMBH, Hannover (DE)

(72) Inventors: Volker Eichenseher, Beratzhausen (DE); Jens Maase, Regensburg (DE)

(73) Assignee: Continental Automotive GmbH, Hannover (DE)

( * ) Notice: Subject to any disclaimer, the term of this patent is extended or adjusted under 35 U.S.C. 154(b) by 364 days.

(21) Appl. No.: 14/414,242

(22) PCT Filed: Jul. 3, 2013

(86) PCT No.: PCT/EP2013/064067
§ 371 (c)(1),
(2) Date: Jan. 12, 2015

(87) PCT Pub. No.: WO2014/009225
PCT Pub. Date: Jan. 16, 2014

(65) Prior Publication Data
US 2015/0226165 A1 Aug. 13, 2015

(30) Foreign Application Priority Data

Jul. 10, 2012 (DE) .................. 10 2012 211 994

(51) Int. Cl.
*F02M 51/00* (2006.01)
*F02M 51/06* (2006.01)
(Continued)

(52) U.S. Cl.
CPC ........... *F02M 51/005* (2013.01); *F02D 41/20* (2013.01); *F02M 51/061* (2013.01); *H02N 2/067* (2013.01);
(Continued)

(58) Field of Classification Search
CPC ............ F02D 41/20; F02D 2041/2003; F02D 2041/2006; F02D 2041/201;
(Continued)

(56) References Cited

U.S. PATENT DOCUMENTS 3,613,644 A 10/1971 Porsche et al.
4,327,394 A 4/1982 Harper
(Continued)

FOREIGN PATENT DOCUMENTS

CN 1856640 A 11/2006
CN 101278114 A 10/2008
(Continued)

*Primary Examiner* — Mahmoud Gimie
*Assistant Examiner* — John Zaleskas
(74) *Attorney, Agent, or Firm* — Laurence A. Greenberg; Werner H. Stemer; Ralph E. Locher

(57) ABSTRACT

A control device actuates at least one fuel injection valve with a high voltage and a comparatively lower voltage in temporally consecutive phases. The control device has supply connections for supplying energy from a motor vehicle battery. One of the connections is connected to vehicle ground. First output connections provide a positive first output voltage with respect to vehicle ground, the voltage being smaller than or equal to a hazard voltage of 60 volts of direct current according to TRBS2131. Second output connections provide a positive second output voltage with respect to vehicle ground, the voltage being greater than the hazard voltage and smaller than a sum of the first output voltage and the hazard voltage. The positive potentials of the first and second output voltages (U1, U2) are linked together.

5 Claims, 1 Drawing Sheet

(51) Int. Cl.
*H02N 2/06* (2006.01)
*H03K 17/687* (2006.01)
*F02D 41/20* (2006.01)

(52) U.S. Cl.
CPC . *H03K 17/6877* (2013.01); *F02D 2041/2006* (2013.01)

(58) Field of Classification Search
CPC ..... F02D 2041/2013; F02D 2041/2017; F02D 2041/2051; F02M 51/005; F02M 51/061; H02N 2/067; H03K 17/08; H03K 17/081; H03K 17/0814; H03K 17/08142; H03K 17/6877
USPC ........ 123/478, 490; 361/152, 154, 155, 160, 361/194
See application file for complete search history.

(56) References Cited

U.S. PATENT DOCUMENTS

| | | | |
|---|---|---|---|
| 4,576,135 A | | 3/1986 | Johnson |
| 5,729,422 A | * | 3/1998 | Henke ................. F02D 41/20 361/156 |
| 5,907,466 A | * | 5/1999 | Dressler .............. F02D 41/20 361/156 |
| 6,236,554 B1 | * | 5/2001 | Groppo ............... F02D 41/20 361/155 |
| 6,407,593 B1 | * | 6/2002 | Kawamoto .......... F02D 41/20 327/110 |
| 6,880,530 B2 | * | 4/2005 | Oyama ................ F02D 41/20 123/479 |
| 7,739,024 B2 | | 6/2010 | Augesky et al. |
| 8,635,033 B2 | | 1/2014 | Hasan et al. |
| 8,714,140 B2 | | 5/2014 | Borchsenius et al. |
| 9,200,580 B2 | | 12/2015 | Brandt |
| 2002/0017279 A1 | * | 2/2002 | Marceca ............. F02D 41/20 123/490 |
| 2002/0157650 A1 | * | 10/2002 | Gaessler ............. F02D 41/009 123/478 |
| 2004/0160725 A1 | * | 8/2004 | Gu ....................... F02D 41/20 361/152 |
| 2005/0030691 A1 | * | 2/2005 | Bolz .................... F02D 41/20 361/152 |
| 2009/0243574 A1 | * | 10/2009 | Mayuzumi .......... F02D 41/20 323/282 |
| 2010/0141089 A1 | | 6/2010 | Schestag et al. |
| 2010/0269793 A1 | * | 10/2010 | Wang .................. F02D 41/221 123/490 |
| 2011/0220067 A1 | * | 9/2011 | Okonogi ............. F02D 41/20 123/480 |
| 2011/0220069 A1 | * | 9/2011 | Hatanaka ............ F02D 41/20 123/490 |
| 2012/0194961 A1 | * | 8/2012 | Yamada .............. F02D 41/20 361/152 |
| 2012/0216783 A1 | * | 8/2012 | Kusakabe ........... F02D 41/20 123/490 |
| 2012/0234299 A1 | * | 9/2012 | Abe .................... F02D 41/20 123/490 |

FOREIGN PATENT DOCUMENTS

| | | |
|---|---|---|
| CN | 101646853 A | 2/2010 |
| CN | 102027221 A | 4/2011 |
| CN | 102422004 A | 4/2012 |
| DE | 102008040860 A1 | 7/2009 |
| DE | 102008056604 A1 | 5/2010 |
| DE | 102011012588 A1 | 1/2012 |
| EP | 0159504 A2 | 10/1985 |
| JP | 2002061534 A * | 2/2002 |

* cited by examiner

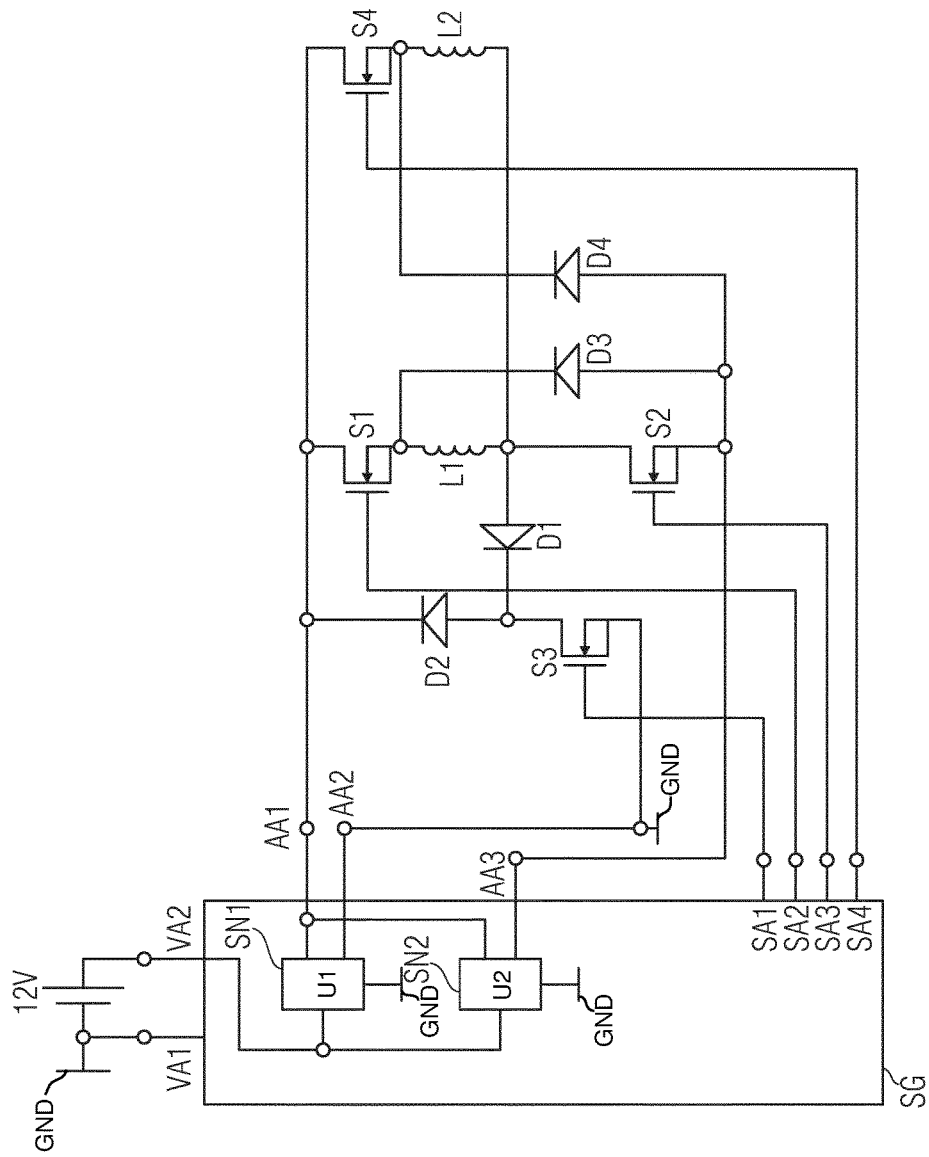

CONTROL DEVICE FOR ACTUATING AT LEAST ONE FUEL INJECTION VALVE, AND A SWITCH ARRANGEMENT COMPRISING SUCH A CONTROL DEVICE

BACKGROUND OF THE INVENTION

Field of the Invention:

Fuel injection valves for motor vehicle engines are mainly opened by means of an actuator against the closing force of a spring. Possible actuators are on the one hand piezo actuators, however, magnetically operated actuators are currently used in most cases. In the case of said actuators, a magnetic coil is excited by means of a current that is flowing through as a result of a prevailing voltage, as a consequence of which as a result of the generated magnetic field and the force that this produces the valve is opened against the closing force of the spring. Generally, the magnetic coil is initially influenced with a high voltage so that the higher current that this generates can urge the magnetic valve against the resilient force. However, when the magnetic valve is in the open position, a lower level of holding force is sufficient to hold the valve in the open position and for this reason a lower voltage is applied to the magnetic coil in order to generate the required magnetic field. In order to produce defined current and voltage ratios, it is necessary ideally for the magnetic field in the magnetic coil to be completely removed after an injection procedure.

DE 10 2008 040 860 A1 describes a switching arrangement for operating fuel injection valves of this type. In this case, a voltage that is approx. 12V higher in comparison to the voltage of the motor vehicle battery is generated from the voltage of the motor vehicle battery by means of a DC/DC converter and is added to the voltage of the motor vehicle battery by means of series connecting the output capacitor of the DC/DC converter to the motor vehicle battery, said output capacitor providing the higher voltage.

The magnetic coils of the motor vehicle injection valves are connected in the case of said switching arrangement in each case on the one hand by way of a first switching means to the positive potential of the higher voltage at the output of the DC/DC converter and by way of a second switching means to the negative potential of the motor vehicle battery that usually forms the vehicle ground.

It is possible by means of suitably controlling the two switches in a sequential manner, for example by means of closing the two switches, to apply the high voltage to the magnetic coil so that initially a high current flows through the magnetic coil, as a consequence of which the fuel injection valve is opened against the closing force of the spring, in that a nozzle needle reveals a nozzle opening. Subsequently, the second switching means is opened, as a consequence of which the magnetic field in the magnetic coil is reduced, in that a current is fed back into the capacitor of the DC/DC converter by way of a free-wheeling diode. Once a current level that is required for maintaining the open position of the fuel injection valve is achieved, the first switch is opened and the second switch is closed, so that the magnetic coil is now energized by means of the motor vehicle battery. In order to terminate the injection procedure, the second switch is also closed, so that the magnetic field in the magnetic coil can be reduced by means of a current flow by way of a free-wheeling diode back into the capacitor of the DC/DC converter.

Generally, in order to reduce the number of transistors that form the switching means, the so-called bank principle is used, wherein in each case two magnetic coils of two fuel injection valves are connected to the vehicle ground by way of only one common switch having the positive potential of the high voltage and by way of in each case the second switch that is allocated to the individual magnetic coils, said second switch functioning as an option switch. However, it is consequently not possible to operate these two fuel valves during the entire two rotations of a combustion cycle of a four-stroke internal combustion engine, said fuel valves being allocated in each case to a first switching means. In order to render this possible, DE 10 2008 040 860 A1 likewise proposes to provide each magnetic coil—in other words each fuel injection valve—with a dedicated first switching means.

The high voltage that is required to open the fuel injection valve generally amounts to 65-70 volts, wherein in the known switching arrangements said voltage is applied to the vehicle ground.

However, this high voltage represents a danger in accordance with the technical regulations relating to operational safety TRBS2131, since by means of an operational means or operations active parts can be directly contacted or different potentials can be bridged and the voltage between an active part and ground or the voltage between active parts is higher than 60 volts direct current and the short circuit current at the operating location is higher than 12 milliamperes direct current and the energy is more than 350 millijoules.

Any contact of the positive potential of the high voltage in the case of simultaneous contact with the vehicle ground, as can easily occur in a workshop, would therefore pose a danger for any workers in the workshop. As a consequence, it would be necessary to provide costly protective measures.

BRIEF SUMMARY OF THE INVENTION

It is the object of the invention to provide a control device for controlling at least one fuel injection valve and a switching arrangement having a control device of this type that does not require special protective measures.

This object is achieved by means of a control device as claimed and a switching arrangement as claimed. Advantageous further developments are disclosed in the subordinate claims.

The control device in accordance with the invention for controlling at least one fuel injection valve with a high voltage and a voltage that is lower in comparison thereto in sequential phases comprises supply connections for supplying energy from a motor vehicle battery, wherein one of the connections is connected to the vehicle ground.

In a manner in accordance with the invention, the control device comprises first output connections for providing a first output voltage that is positive with respect to the vehicle ground and is lower than or equal to the hazardous voltage according to TRBS2131 of 60 volts direct current. It comprises moreover second output connections for providing a second output voltage that is positive with respect to the vehicle ground and is higher than or equal to the hazardous voltage and lower than the summation of the first output voltage and the hazardous voltage, wherein the positive potential of the first and the second output voltage are connected to one another.

By means of the feature in accordance with the invention of connecting the positive potentials of a first and a second output voltage, of which one is higher than or equal to the hazardous voltage but lower that the summation of the first output voltage and the hazardous voltage, none of the output voltages have with respect to the vehicle ground per se a higher voltage than the hazardous voltage, despite this, the higher output voltage is sufficient to ensure a rapid opening of the valve.

It is of particular advantage if the first output voltage is approx. 12 volts, in other words the stabilized voltage of the motor vehicle battery, and the second output voltage amounts to approx. 65 volts to 70 volts.

The second output voltage can be obtained in the control device by means of a DC/DC converter from the supply voltage of the motor vehicle battery.

A switching arrangement in accordance with the invention for controlling at least one fuel injection valve comprising a first magnetic valve coil comprises a control device in accordance with the invention. Furthermore, the positive potentials of the first output voltage and the second output voltage are connected by way of the switching path of a first controllable switching means to the first connection of the first magnetic valve coil. The negative potential of the first output voltage is connected to the second connection of the magnetic valve coil by way of the switching path of a third controllable switching means and a first diode that is polarized in the reverse direction.

The negative potential of the second output voltage is connected by way of the switching path of a second controllable switching means to the second connection of the magnetic valve coil, moreover a second diode is arranged in the flow direction between the connection point of the first diode and the second switching means and the positive potentials of the first output voltage and the second output voltage of the control device. A third diode is arranged in the reverse direction between the first connection of the magnetic valve coil and the negative potential of the second output voltage of the control device, wherein the control connections of the first and the second controllable switching means are connected to the control outputs of the control device.

The magnetic valve coil of a motor vehicle injection valve can be controlled by means of the switching arrangement in accordance with the invention in a simple manner sequentially with a high and a lower voltage without an inadmissibly high hazardous voltage with respect to the vehicle ground occurring at the magnetic valve coil.

In a further development of the invention, the switching arrangement comprises a second magnetic valve coil of a further fuel injection valve and the first connection of said second magnetic valve coil is connected by way of the switching path of a fourth controllable switching means to the positive potentials of the first output voltage and the second output voltage of the control device and is connected by way of a fourth diode that is polarized in the reverse direction to the negative potential of the second output voltage of the control device and the second connection of said second magnetic valve is connected to the second connection of the first magnetic valve coil.

As a consequence, it is possible for energy to flow in a simple manner through two magnetic valve coils according to the bank principle.

BRIEF DESCRIPTION OF THE SEVERAL VIEWS OF THE DRAWING

The invention is explained in detail hereinunder with reference to an exemplary embodiment with the aid of a FIGURE, in which the:

FIGURE illustrates a detailed circuit diagram for controlling the magnetic valve coil and a schematic diagram for the control device in accordance with the invention.

DESCRIPTION OF THE INVENTION

The FIGURE illustrates a control device SG that comprises two supply connections VA1, VA2 for the purpose of providing a connection to a motor vehicle battery that has an operating voltage of approx. 12volts.

Generally, lead acid rechargeable batteries are used for this purpose, said batteries when in the fully charged state having a no-load voltage of higher than 13 volts, but they are mainly described as 12 volt batteries. The negative potential of the motor vehicle voltage is connected to the vehicle ground GND.

The control device SG comprises moreover first output connections AA1 and AA2 for the purpose of providing a first output voltage U1 that is positive with respect to the vehicle ground GND and is lower than or equal to the hazardous voltage according to TRBS2131 of 60 volts direct current.

The second output connection AA2 is connected to the vehicle ground connection GND. It is preferred that the first output voltage U1 is selected so that it is sufficiently high in order to render possible the holding current for a motor vehicle injection valve that is already open.

It is preferred that the first supply voltage U1 is provided at the output of a first DC/DC converter SN1 that generates this voltage from the motor vehicle battery voltage of 12 volts by means of a DC/DC conversion, in the most simple case merely stabilizes the motor vehicle battery voltage of 12 volts.

Moreover, the control device SG comprises a third output connection AA3 between which and the first output connection a positive second output voltage U2 prevails that comprises with respect to the vehicle ground GND merely a value corresponding to the difference between the second output voltage U2 and the first output voltage U1 since the two output voltages U1, U2 are connected to one another at their positive potentials. Consequently, although he second output voltage U2 itself is higher than the hazardous voltage according to TRBS2131, none of its potentials comprise with respect to the vehicle ground a value that is higher than the hazardous voltage of 60V.

The second output voltage U2 can likewise be generated in an advantageous manner by means of a second DC/DC converter SN2 from the voltage of the vehicle battery.

It is achieved in a manner in accordance with the invention by virtue of this feature that with respect to the vehicle ground GND no potential has a voltage that is higher than the hazardous voltage. Nevertheless, the second output voltage U2 is higher than the hazardous voltage and consequently sufficiently high in order to be able to general the required higher current for opening a fuel injection valve.

The control device SG in accordance with the invention DC is primarily designed so as to provide a first and a second output voltage U1, U2 whose potentials with respect to the vehicle ground have a voltage that is lower than the hazardous voltage, but the second voltage is higher than the hazardous voltage, it does, however, have the advantage that if necessary it is also possible without having to make any special changes to provide a lower second voltage.

In addition, the FIGURE illustrates a switching arrangement for controlling at least one fuel injection valve, which comprises a magnetic valve coil, having a control device SG in accordance with the invention.

The switching arrangement comprises for this purpose a first controllable switching means S1 that is embodied in the illustrated exemplary embodiment as a n-channel MOSFET and a first connection of a first magnetic valve coil L1 of a fuel injection valve is connected by way of the load path of said switching means to the positive potential of the first and the second output voltages U1, U2, namely the output connection AA1. The second connection of the first magnetic valve coil L1 is connected by way of a first diode D1 that is polarized in the forward direction and a third controllable switching means S3 that is likewise embodied as a n-channel MOSFET to the negative potential of the first output voltage U1 by means of a connection to the second output connection AA2. This second output connection AA2 is connected to the vehicle ground GND so that the magnetic valve coil L1 can be energized by means of applying the first output voltage U1 by means of actuating the first switching means S1 and the third switching means S3.

In order to actuate the first switching means S1 and the third switching means S3, the control connections thereof are connected to a second control output SA2 and respectively a first control output SA1 of the control device SG. The control device SG comprises for the purpose of controlling the switching means S1, S3 a control logic circuit by way of example in the form of a program-controlled microprocessor, which is actually prior art and not illustrated in detail in the FIGURE.

The second connection of the first magnetic valve coil L1 is connected by way of a second controllable switching means S2 that is likewise embodied in the illustrated exemplary embodiment as a n-channel MOSFET to the third output connection AA3 of the control device SG and the negative potential of the second output voltage U2 is applied to said control device.

The control connection of the second switching means S2 is connected to a third control output SA3 of the control device SG. The third control output SA3 is likewise influenced by switching signals of the—not illustrated—control logic circuit of the control logic circuit of the control device SG.

The connection point of the first diode D1 and of the third switching means S3 is connected by way of a second diode D2 that is polarized in the forward direction to the first output connection AA1 and the first connection of the magnetic valve coil L1 is connected by way of a third diode D3 that is polarized in the reverse direction to the third output connection AA3 of the control device SG, in other words to the negative potential of the second output voltage U2.

The control and the current paths of the switching arrangement in accordance with the invention are to be explained hereinunder: in order to open the first fuel injection valve, the first magnetic valve coil L1 is energized by applying the second output voltage U2 of the control device SG.

The first switching means S1 and the second switching means S2 are hereby closed by means of the control device SG by applying corresponding levels at its control outputs SA1 and SA2, so that a current can flow from the output connection AA1 through the first switching means S1, the magnetic valve coil L1 and the second switching means S2 to the third output connection AA3. If the energy supply to the magnetic valve coil L1 is interrupted by opening the first switching means S1 or also opening the first and the second switching means S1, S2, then the magnetic field that is stored in the magnetic valve coil L1 reduces by means of a current flow through the magnetic valve coil L1 and also the first, the second and the third diode D1, D2, D3 that function as free-wheeling diodes, as a consequence of which the energy is supplied back into the output capacitor of the second DC/DC converter SN2. It is possible hereby to reclaim a part of the energy that has been previously stored in the magnetic valve coil L1.

In order to hold the fuel injection valve open, once the current that is flowing through the magnetic valve coil has dropped to the holding current that is required in order to hold the fuel injection valve open, the first switching means S1 is closed and also the third switching means S3 is closed, whereas the second switching means S2 is opened so that the magnetic valve coil L1 is now energized only by means of the first output voltage U1 and a current flows from the output connection AA1 through the first switching means S1, the magnetic valve coil L1 by way of the first diode D1 and the third switching means S3 back to the negative potential of the first output voltage U1 and accordingly the vehicle ground GND.

In order to close the fuel injection valve, the first switching means S1 is opened so that the energy that is stored in the magnetic valve coil L1 can finally discharge by way of the first, the second and the third diode D1, D2, D3 into the output capacitor of the second DC/DC converter SN2.

The switching arrangement in accordance with the invention can also be used according to the bank principle, in that a further series connection comprising a fourth switching means S4 and a second magnetic valve coil L2 is switched in parallel to the series circuit comprising the first switching means S1 and the magnetic valve coil L1, and the connection point of the fourth switching means S4 and the second magnetic valve coil L2 is connected to the third output connection AA3 by way of a fourth diode D4 that is polarized in the reverse direction. Moreover, the control connection of the fourth switching means S4 is connected to a fourth control output SA4 of the control device SG.

The second and the third switching means S3, S4 are therefore used for the purpose of applying the first or the second output voltage U1, U2 at either the first or the second magnetic valve coil L1, L2 by means of additionally actuating either the first or the fourth switching means S1, S4, wherein the first and the fourth switching means S1, S4 as used as option switches.

The invention claimed is:
1. A control device for controlling at least one fuel injection valve in sequential phases with a relatively high voltage and a relatively lower voltage, the control device comprising:
  supply connections for a supply of energy to the control device from a motor vehicle battery, a first supply connection of said supply connections being connected to a vehicle ground;
  a first DC/DC converter for generating a first output voltage from a supply voltage from a second supply connection of said supply connections, said first DC/DC converter having at least a first output and a second output, said first output connected to a first output connection, said second output connected to a second output connection;
  a second DC/DC converter for generating a second output voltage from a supply voltage from the second supply connection of said supply connections, said second DC/DC converter having at least a first output with positive potential and a second output with negative potential, said first output connected to said first output connection, said second output being connected to a third output connection;

said first output connection and said second output connection carrying the first output voltage that is positive with respect to the vehicle ground and lower than or equal to a hazardous voltage of 60 volts direct current;

said first output connection and said third output connection for carrying said second output voltage that is positive with respect to the vehicle ground and higher than the hazardous voltage and lower than a sum of the first output voltage and the hazardous voltage, where said third output connection is not directly connected to the vehicle ground; and positive potentials of the first and second output voltages being connected to one another.

2. The control device according to claim 1, wherein the first output voltage amounts to 12 volts and the second output voltage amounts to a voltage between 65 volts and 70 volts.

3. The control device according to claim 1, wherein the supply voltage is 12 volts.

4. A switching arrangement for controlling at least one fuel injection valve having a first magnetic valve coil with a first connection and a second connection, the switching arrangement comprising:

the control device according to claim 1;

a first controllable switching device, wherein the positive potentials of the first output voltage and the second output voltage are connected to the first connection of the first magnetic valve coil by way of a switching path of said first controllable switching device;

a second controllable switching device, wherein a negative potential of the second output voltage is connected to the second connection of the first magnetic valve coil by way of a switching path of said second controllable switching device;

a third controllable switching device, wherein a negative potential of the first output voltage is connected to the second connection of the first magnetic valve coil by way of a switching path of said third controllable switching device and a first diode that is polarized in a reverse direction;

a second diode connected in a flow direction between a connection node of said first diode and said third controllable switching device and the positive potentials of the first output voltage and the second output voltage of said control device; and a third diode connected in a reverse direction between the first connection of the first magnetic valve coil and the negative potential of the second output voltage of the control device.

5. The switching arrangement according to claim 4, wherein a further fuel injection valve has a second magnetic valve coil, and comprising:

a fourth controllable switching device having a switching path connecting a first connection of the second magnetic valve coil to the positive potentials of the first output voltage and the second output voltage of said control device; and a diode that is polarized in a reverse direction connecting the negative potential of the second output voltage of said control device to the first connection of the second magnetic valve coil; and wherein the second connection of the second magnetic valve coil of the further fuel injection valve is connected to the second connection of the first magnetic valve coil.

* * * * *